US009718986B2

(12) United States Patent
Liao et al.

(10) Patent No.: US 9,718,986 B2
(45) Date of Patent: Aug. 1, 2017

(54) EPOXY RESIN BLEND

(71) Applicant: Taiwan Union Technology Corporation, Hsinchu County (TW)

(72) Inventors: Chih Wei Liao, Pingzhen (TW); Hsuan-Hao Hsu, Xin Zhuang (TW)

(73) Assignee: TAIWAN UNION TECHNOLOGY CORPORATION (TW)

(*) Notice: Subject to any disclaimer, the term of this patent is extended or adjusted under 35 U.S.C. 154(b) by 0 days.

(21) Appl. No.: 14/163,161

(22) Filed: Jan. 24, 2014

(65) Prior Publication Data
US 2014/0161982 A1 Jun. 12, 2014

Related U.S. Application Data

(63) Continuation of application No. 12/494,273, filed on Jun. 30, 2009, now abandoned.

(60) Provisional application No. 61/165,632, filed on Apr. 1, 2009.

(51) Int. Cl.
C09D 163/00 (2006.01)
C08J 5/24 (2006.01)
C08G 59/30 (2006.01)
C08G 63/00 (2006.01)
D06M 15/55 (2006.01)
C08L 63/00 (2006.01)
H05K 1/03 (2006.01)

(52) U.S. Cl.
CPC ......... C09D 163/00 (2013.01); C08G 59/304 (2013.01); C08G 59/308 (2013.01); C08J 5/24 (2013.01); C08L 63/00 (2013.01); C08J 2363/00 (2013.01); D06M 15/55 (2013.01); D10B 2101/06 (2013.01); H05K 1/0326 (2013.01); Y10T 442/2098 (2015.04); Y10T 442/2951 (2015.04)

(58) Field of Classification Search
CPC .. C09D 163/00; C09D 163/04; C09D 163/06; C09D 163/08; C09D 163/10; C08L 63/00; C08L 63/04; C08L 63/06; C08L 63/08; C08L 63/10; C08G 59/18–59/72; C08G 59/308; C08J 5/24; C08J 2363/00; C08J 2363/02; C08J 2363/04; C08J 2363/06; C08J 2363/08; C08J 2363/10; H05K 1/03–1/119; Y10T 442/2951; Y10T 442/2926; Y10T 442/2098
USPC .............................. 442/156, 175, 253, 378; 427/372.2–397.8; 528/421; 525/107–122; 428/457–472.3, 688–703, 428/542.8, 606–608, 426–442
See application file for complete search history.

(56) References Cited

U.S. PATENT DOCUMENTS

| 5,659,004 | A | * | 8/1997 | Takigawa ............. C08G 59/245 523/443 |
| 5,965,245 | A | | 10/1999 | Okano et al. |
| 2005/0095434 | A1 | | 5/2005 | Hirota et al. |
| 2009/0030147 | A1 | | 1/2009 | Takahata et al. |
| 2009/0032286 | A1 | | 2/2009 | Urakawa et al. |
| 2010/0025094 | A1 | | 2/2010 | Tamiya et al. |
| 2010/0255740 | A1 | | 10/2010 | Liao |
| 2011/0224332 | A1 | * | 9/2011 | He ......................... C08G 59/42 523/456 |

FOREIGN PATENT DOCUMENTS

| JP | 2007246668 A | 9/2007 |
| TW | 200604239 | 2/2006 |
| WO | 2006109744 A1 | 10/2006 |
| WO | 2008032383 A1 | 3/2008 |

OTHER PUBLICATIONS

Office Action from Taiwan Intellectual Property Office, Dated Dec. 25, 2012 (English Summary Included).

* cited by examiner

Primary Examiner — Frank Vineis
(74) Attorney, Agent, or Firm — Su IP Consulting

(57) ABSTRACT

An example method to prepare a prepreg is disclosed. In one embodiment, the method includes applying a mixture on a fibrous material and heating the mixture and the fibrous material to a temperature greater than about 225 degrees Celsius during a process of preparing the prepreg. The mixture includes an epoxy compound, a compound having a ring structure, and a crosslinking agent.

12 Claims, 6 Drawing Sheets

EPOXY RESIN BLEND

CROSS-REFERENCE TO RELATED APPLICATIONS

This application is a continuation of U.S. patent application Ser. No. 12/494,273 filed on Jun. 30, 2009, which claims the benefit of U.S. Provisional Application No. 61/165,632, filed on Apr. 1, 2009. The related applications are hereby incorporated by reference in their entireties.

BACKGROUND OF THE DISCLOSURE

Field of the Disclosure

Embodiments of the present disclosure generally relate to an epoxy resin blend and more specifically to an epoxy resin blend which may serve as a matrix in a laminate.

Description of the Related Art

Unless otherwise indicated herein, the approaches described in this section are not prior art to the claims in this application and are not admitted to be prior art by inclusion in this section.

Epoxy resin blends are important in the electronics industry and are employed in various areas, such as, motors, generators, transformers, switchgears, bushings, and insulators. Epoxy resin blends are excellent electrical insulators and may protect electrical components from short circuiting, dust, and moisture. In the electronics industry, epoxy resin blends are widely used in manufacturing electronic components, such as, integrated circuits, transistors, hybrid circuits, and printed circuit boards. However, the applications of epoxy resin blends are limited by some of their properties.

SUMMARY OF THE DISCLOSURE

Embodiments of the present disclosure set forth a method to prepare a prepreg. In one embodiment, the method includes applying a mixture on a fibrous material and heating the mixture and the fibrous material to a temperature greater than about 225 degrees Celsius during a process of preparing the prepreg. The mixture includes an epoxy compound, a compound having a ring structure, and a crosslinking agentprepreg.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
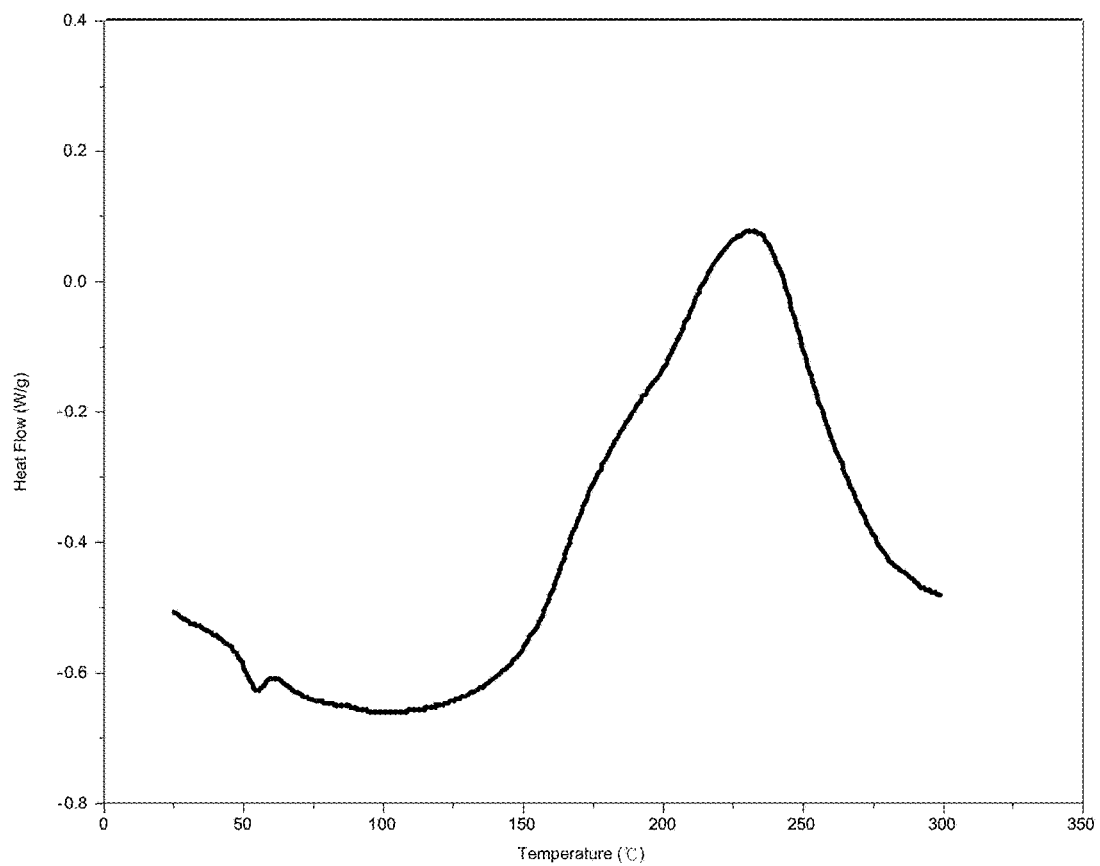
FIG. 1 illustrates a Differential Scanning calorimetry (DSC) diagram according to one embodiment of the disclosure.

In the present disclosure, "curing" refers a process of hardening a resin material. A "prepreg" broadly refers to a material which comprises or is impregnated with an amount of resin before a molding operation.

One embodiment of the present disclosure sets forth an epoxy resin blend. The epoxy resin blend includes at least one epoxy compound, a modifier, a crosslinking agent, a compound having an allyl group (hereinafter the "allyl compound") and other compounds such as catalysts and/or fillers.

An epoxy compound broadly refers to a chemical substance, which generally includes a three-member ring known as an epoxy, epoxide, oxirane, or ethoxyline group. In some implementations, the epoxy compound may include brominated and/or phosphonated epoxy compounds, so that the epoxy resin blend can be flame retardant. Generally, the epoxy compound may include, without limitation, an aromatic epoxy compound, an alicyclic epoxy compound, and an aliphatic epoxy compound.

Examples of the aromatic epoxy compounds may include glycidyl ethers of polyhydric phenols, such as hydroquinone, resorcinol, bisphenol A, bisphenol F, 4,4'-dihydroxybiphenyl, novolak, and tetrabromobisphenol A.

Examples of the alicyclic epoxy compounds may include hydrogenated bisphenol A diglycidyl ether, (3,4-epoxycyclohexyl)methyl 3,4-epoxycyclohexylcarboxylate, 3,4-epoxy-1-methylcyclohexyl 3,4-epoxy-1-methylhexanecarboxylate, (6-methyl-3,4-epoxycyclohexyl)methyl 6-methyl-3,4-epoxycyclohexanecarboxylate, (3,4-epoxy-3-methylcyclohexyl)methyl 3,4-epoxy-3-methylcyclohexanecarboxylate, (3,4-epoxy-5-methylcyclohexyl)methyl 3,4-epoxy-5-methylcyclohexanecarboxylate, bis(3,4-epoxycyclohexylmethyl) adipate, methylenebis(3,4-epoxycyclohexane), 2,2-bis(3,4-epoxycyclohexyl)propane, dicyclopentadiene diepoxide, ethylenebis(3,4-epoxyyclohexanecarboxylate), dioctyl epoxyhexahydrophthalate, and di-2-ethylhexyl epoxyhexahydrophthalate.

Examples of the aliphatic epoxy compounds may include glycidyl ethers of polyhydric alcohols, such as 1,4-butanediol diglycidyl ether, 1,6-hexanediol diglycidyl ether, glycerol triglycidyl ether, trimethylolpropane triglycidyl ether, sorbitol tetraglycidyl ether, dipentaerythritol hexaglycidyl ether, polyethylene glycol diglycidyl ether, and polypropylene glycol diglycidyl ether; polyether polyol polyglycidyl ethers obtained by adding one or more alkylene oxides to aliphatic polyhydric alcohols, such as propylene glycol, trimethylolpropane, and glycerol; and diglycidyl esters of aliphatic long-chain dibasic acids.

The modifier in the epoxy resin blend may comprise, without limitation, an electrical property modifier for enhancing the electrical properties of the epoxy resin blend, and a mechanical property modifier for enhancing the mechanical properties of the epoxy resin blend. Examples of the electrical property modifier may include cyanate ester derived compounds and bismaleimide triazine copolymers. Examples of the mechanical property modifier may include rubber modified compounds, such as rubber modified epoxy compounds.

A cyanate ester derived compound broadly refers to a chemical substance generally based on a bisphenol or novolac derivative, in which the hydrogen atom of at least one hydroxyl group of the bisphenol or novolac derivative is substituted by a cyanide group. Therefore, a cyanate ester derived compound generally has an —OCN group. In some implementations, a cyanate ester derived compound may refer to, without limitation, 4,4'-ethylidenebisphenylene cyanate, 4,4'-dicyanatodiphenyl, 2,2-bis(4-cyanatophenyl) propane, bis(4-cyanato-3,5-dimethylphenyl)methane, bis(4-cyanatophenyl)thioether, bis(4-cyanatophenyl)ether, prepolymer of bisphenol A dicyanate in methyl ethyl ketone, 1,1-bis(4-cyanatophenyl)ethane, 1,1-bis(4-cyanatophenyl)methane, 1,3-bis(4-cyanatophenyl-1-(methylethylidene)) benzene, bis(4-cyanatophenyl)ether, bis(4-cyanatophenyl)-2,2-butane, 1,3-bis[2-(4-cyanato phenyl)propyl]benzene, tris(4-cyanatophenyl)ethane, cyanated novolak, and cyanated phenoldicyclopentadiene adduct.

A bismaleimide triazine copolymer generally includes a triazine ring structure and a bismaleimide structure. The triazine ring structure may be formed from three cyano groups. The double bond of the maleimide group can copolymerize with the cyano groups and form a heterocyclic six-membered aromatic ring structure with two nitrogen atoms.

In some implementations, the rubber modified compound may be derived from a compound modified by butadiene rubber, nitrile rubber, and acrylonitrile butadiene rubber, such as carboxylterminated butadiene acrylonitrile rubber.

The crosslinking agent may include, without limitation, derivatives of acrylate and methacrylate. In some implementations, the crosslinking agent can be styrene maleic anhydride (SMA) copolymer. SMA copolymer is commercially available in a broad range of molecular weights and monomer weight ratios. Typically, the molecular weight of SMA copolymer may vary from approximately 1,400 daltons to approximately 14,000 daltons (weight average molecular weight), and the weight ratio of styrene monomer to maleic anhydride may range from approximately 1:1 to approximately 10:1.

The allyl compound may include an allyl group, which is an alkene hydrocarbon group with the formula $H_2C\!=\!CH\!-\!CH_2$. The allyl compound may further include at least two hydroxyl groups, which may crosslink with the epoxy compound set forth above and form a network.

In some implementations, the epoxy resin blend may further include other compounds such as, without limitation, lubricants, catalysts, and/or fillers. The catalyst can be inorganic or organic. For example, the inorganic catalyst may be zinc acetylacetonates and cobalt acetylacetonates and the organic catalyst may be 2-phenyl imidazole and 2-ethyl-4-methylimidazole. The filler may be inorganic, such as talc, clay, and silicon dioxide.

The ratios of the epoxy compound, the modifier, the crosslinking agent, the allyl compound and the catalysts and/or fillers may vary, depending on the applications of the epoxy compound. In some implementations, the epoxy compound includes more than one epoxy compound and the modifier includes more than one modifier. The weight percentage of the epoxy compounds is in a range of approximately 30% to approximately 50% of the epoxy resin blend. The weight percentage of the modifiers is in a range of approximately 10% to approximately 30% of the epoxy resin blend. The weight percentage of the crosslinking agent is in a range of approximately 20% to approximately 40% of the epoxy resin blend.

According to one embodiment of the present disclosure, the epoxy resin blend includes two epoxy compounds, two modifiers, a crosslinking agent, an allyl compound, two catalysts and a filler. The two epoxy compounds include a first brominated epoxy compound and a second brominated epoxy compound. The two modifiers include a bisphenol A dicyanate derived compound and a carboxylterminated butadiene acrylonitrile rubber modified epoxy compound. The crosslinking agent includes a styrene maleic anhydride copolymer. The allyl compound includes an aromatic compound. The catalysts include cobalt acetylacetonates and 2-ethyl-4-methylimidazole. The filler is silicon dioxide. The two epoxy compounds, the two modifiers, the crosslinking agent, the allyl compound, the two catalysts and the filler mentioned above are commercially available. The suppliers, the names of the commercially available products and the structures are listed in Table 1.

TABLE 1

| Compound | Supplier | Product Name | Structure |
|---|---|---|---|
| Brominated Epoxy 1 | Dow Chemical Co. | DER 560 | 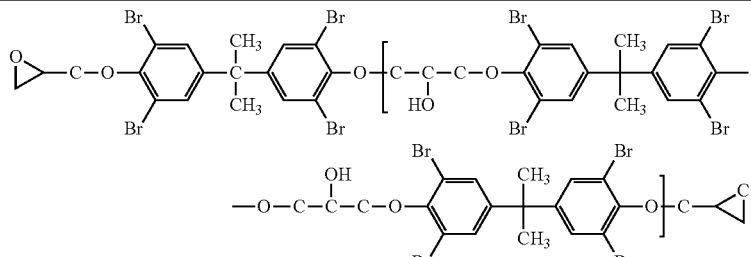 |
| Brominated Epoxy 2 | Hexion Specialty Chemicals, Inc. | 1134 | 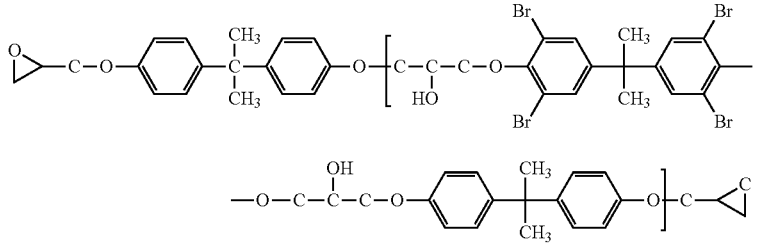 |

TABLE 1-continued

| Compound | Supplier | Product Name | Structure |
|---|---|---|---|
| Modifier 1 | Lonza Inc. | Primaset® BA-230S | (structure shown) |
| Modifier 2 | Hexion Specialty Chemicals, Inc. | 58005 | (structure shown) |
| Crosslinking Agent | Sartomer Company, Inc. | SMA EF-40 Flake | (structure shown) |
| Allyl Compound | Kolon Chemical Co. | LKH 4020 | |
| Catalyst 1 | PCI Synthesis Inc. | 2,4-EMI | (structure shown) |
| Catalyst 2 | Aldrich | cobalt acetylacetonates | $Co(C_5H_7O_2)_3$ |
| Filler | Sibelco Asia | Megasil® 525 | $SiO_2$ |

In one implementation of preparing an epoxy varnish, 154.5 grams of a first brominated epoxy compound, 109.6 grams of a second brominated epoxy compound, 105.82 grams of bisphenol A dicyanate derived compound, 200 grams of styrene maleic anhydride copolymer, 23 grams of carboxylterminated butadiene acrylonitrile rubber modified epoxy compound, 0.3 grams of allyl compound, 90 grams of silicon dioxide were mixed with 0.056 grams of cobalt acetylacetonates and 0.28 grams of 2-ethyl-4-methylimidazole in a solvent mixture of methyl ethyl ketone and propylene glycol methyl ether acetate.

Example 1

Prepreg

In one implementation, the epoxy varnish may be used for preparing a prepreg. A fibrous material is immersed in and impregnated with the epoxy varnish. The fibrous material includes, without limitation, glass cloth and matting, paper, asbestos paper, mica flakes, cotton bats, duck muslin, canvas and synthetic fabric such as nylons and polyethylene terephthalate, and woven/non-woven fiberglass fabrics. In one implementation, woven fiberglass fabric was immersed in and impregnated with the epoxy varnish. The woven fiberglass fabric was then pulled by several rollers to an oven. The oven was configured to be set at several target temperatures at different locations of the oven. The heat sources of the oven are infrared radiant and hot air. A sensor was disposed on the woven fiberglass fabric and configured to record the temperature curve during the period in which the woven fiberglass fabric traveled in the oven. The woven fiberglass fabric and the epoxy varnish formed a prepreg after being heated by the oven. In some implementations, the temperature does not exceed 400 degrees Celsius, since the epoxy varnish is likely to decompose when being heated to such a high temperature. The maximum recorded temperature was approximately 230 degrees Celsius.

In some implementations, the epoxy varnish may be used for preparing an article of manufacture. Instead of the fibrous material set forth above, a carrier is immersed in the epoxy varnish. The carrier may include, without limitation, a metal material (e.g., foils or sheets of copper or aluminum).

Copper Clad Laminate

The prepreg may be used for preparing a copper clad laminate. Each prepreg is stacked between two copper sheets. Then, one or more sheets of the prepreg, sandwiched between the copper sheets, are then interposed between two stainless steel plates and the resulting assembly is press-molded at 190 degrees Celsius at a pressure of 30 kg/cm² for 120 minutes to prepare a copper-clad laminate.

Characteristic Analysis

On the prepreg, the epoxy varnish was cured to a specified level after being heated in the oven. The prepreg was folded and the cured epoxy varnish was detached from the woven fiberglass fabric and broke into epoxy powders. The epoxy powders were analyzed with Differential Scanning calorimetry (DSC). 10-30 mg of the epoxy powder was heated at a rate of 5 degrees Celsius per minute by the DSC device. The DSC diagram is illustrated in FIG. 1. The unit of the X-axis is ° C., and the unit of the Y-axis is Walt/g.

Based on IPC TM-650 2.3.18A, the epoxy powders were further analyzed to determine the first gel time value. After ninety days, the same analysis was performed to obtain the second gel time value of the epoxy powders. The ratio of the second gel time value to the first gel time value is approximately 93%.

The copper clad laminate was also thermomechanically analyzed based on IPC-TM-650 2.4.24.1. At an isothermal temperature of 288 degrees Celsius defined in IPC-TM-650 2.4.24.1, the time to delamination was approximately 22 minutes.

Examples 2 and 3

In other implementations, the same woven fiberglass fabric was immersed in the same epoxy varnish to form the same prepreg. The settings of the target temperatures of the oven were changed so that the temperature distributions in the oven were different from the temperature distribution of the oven in Example 1. The maximum recorded temperatures were approximately 240 degrees Celsius and approximately 250 degrees Celsius in Example 2 and Example 3, respectively.

Figure 2:
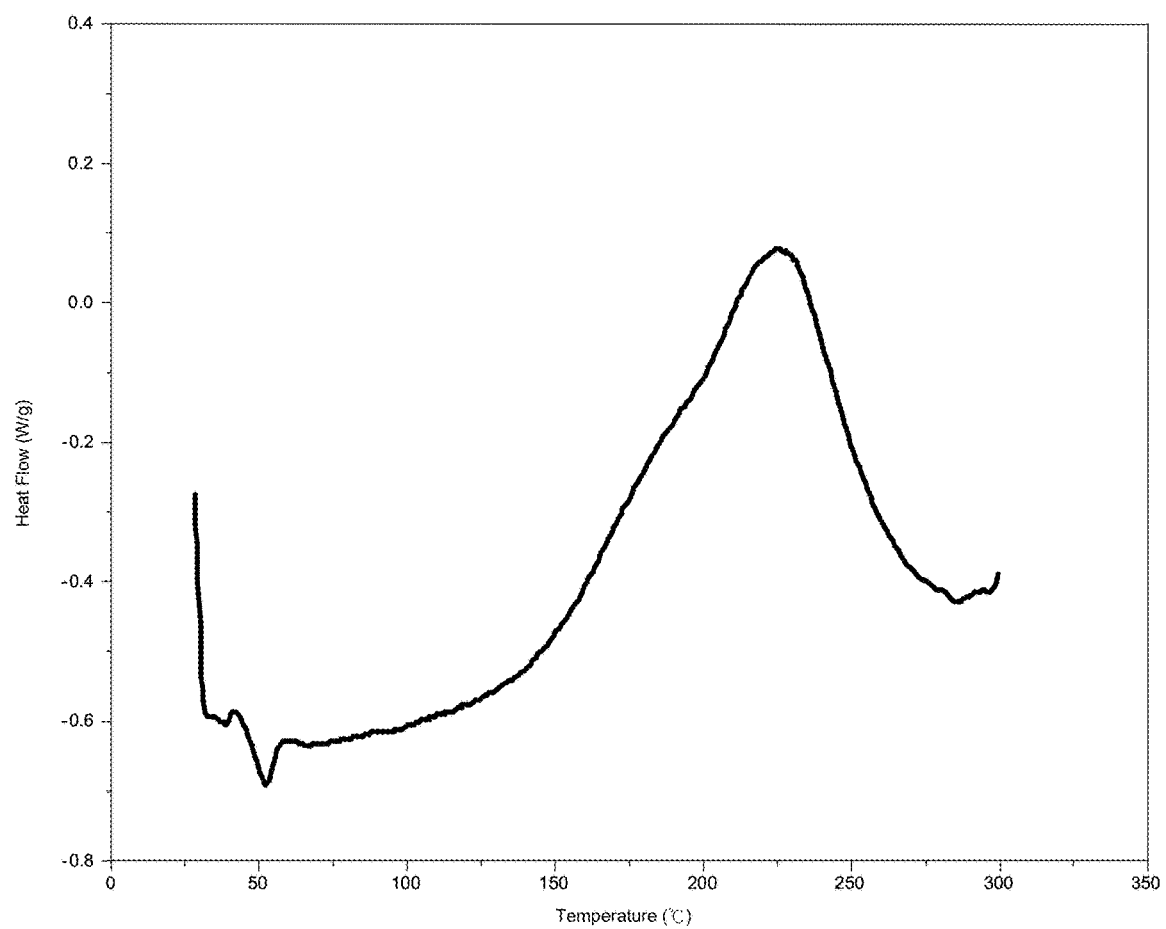
FIG. 2 illustrates a DSC diagram according to one embodiment of the disclosure.

In Example 2, the epoxy varnish was cured to a specified level after being heated in the oven. The prepreg was folded and the cured epoxy varnish was detached from the woven fiberglass fabric and broke into epoxy powders. The epoxy powders were analyzed with DSC. The epoxy powders were also analyzed based on IPC TM-650 2.3.18A to determine the ratio of the second gel time value to the first gel time value. The DSC diagram is illustrated in FIG. 2, and the ratio of the second gel time value to the first gel time value is 92%.

Figure 3:
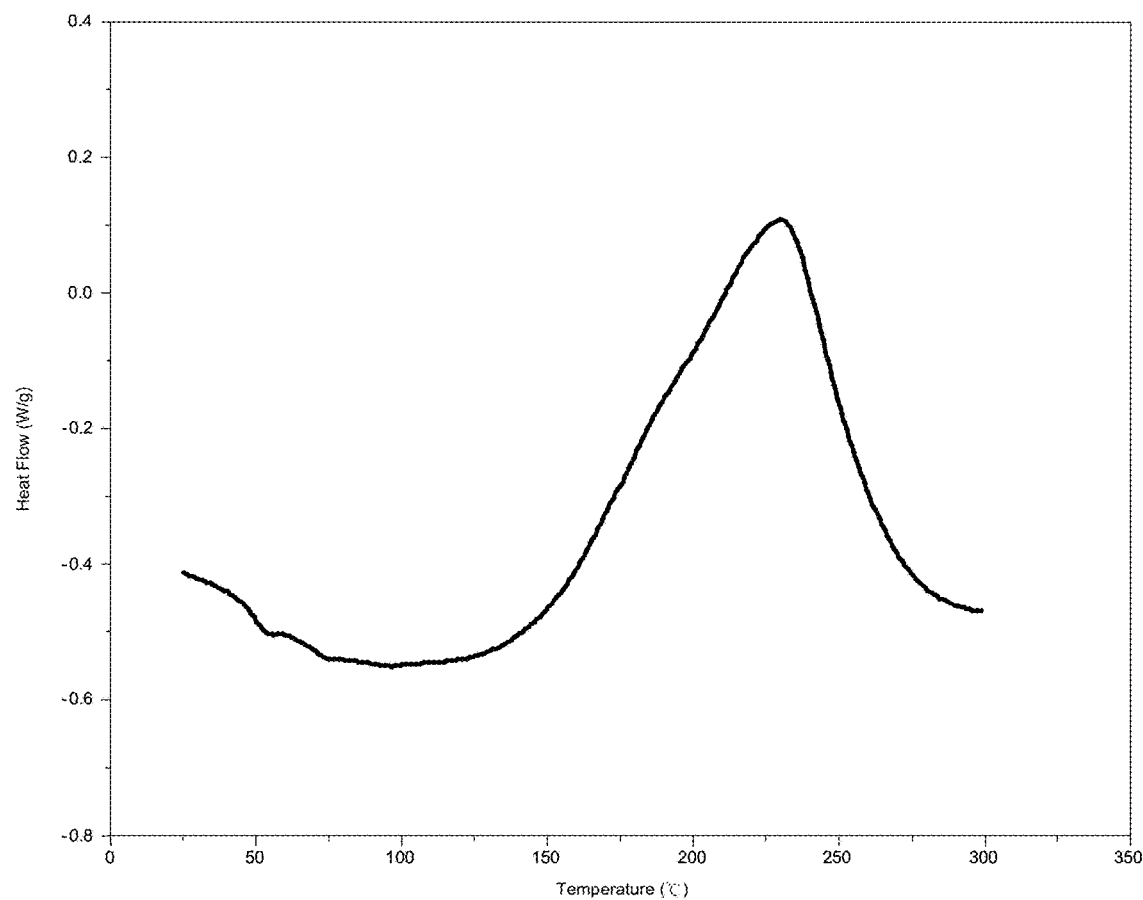
FIG. 3 illustrates a DSC diagram according to one embodiment of the disclosure.

As set forth above, in Example 3, the epoxy powders were analyzed with DSC. The epoxy powders were also analyzed based on IPC TM-650 2.3.18A to determine the ratio of the second gel time value to the first gel time value. The DSC diagram is illustrated in FIG. 3, and the ratio of the second gel time value to the first gel time value is 94%.

Copper clad laminates may be prepared from the prepregs described in Example 2 and Example 3 according to the method of preparing a copper-clad laminate in Example 1. The copper clad laminates prepared from Example 2 and Example 3 were thermomechanically analyzed based on IPC-TM-650 2.4.24.1.

For a copper clad laminate prepared from the prepreg described in Example 2, the time to delamination was approximately 22 minutes at an isothermal temperature of 288 degrees Celsius defined in IPC-TM-650 2.4.24.1.

For a copper clad laminate prepared from the prepreg described in Example 3, the time to delamination was approximately 23 minutes at an isothermal temperature of 288 degrees Celsius defined in IPC-TM-650 2.4.24.1.

Comparative Example 1

The same woven fiberglass fabric was immersed in the same epoxy varnish to form the same prepreg. The settings of the target temperatures of the oven were changed so that the temperature distributions in the oven were different from the temperature distribution of the oven in Examples 1, 2, and 3. The maximum recorded temperature in Comparative Example 1 was approximately 220 degrees Celsius.

Figure 4:
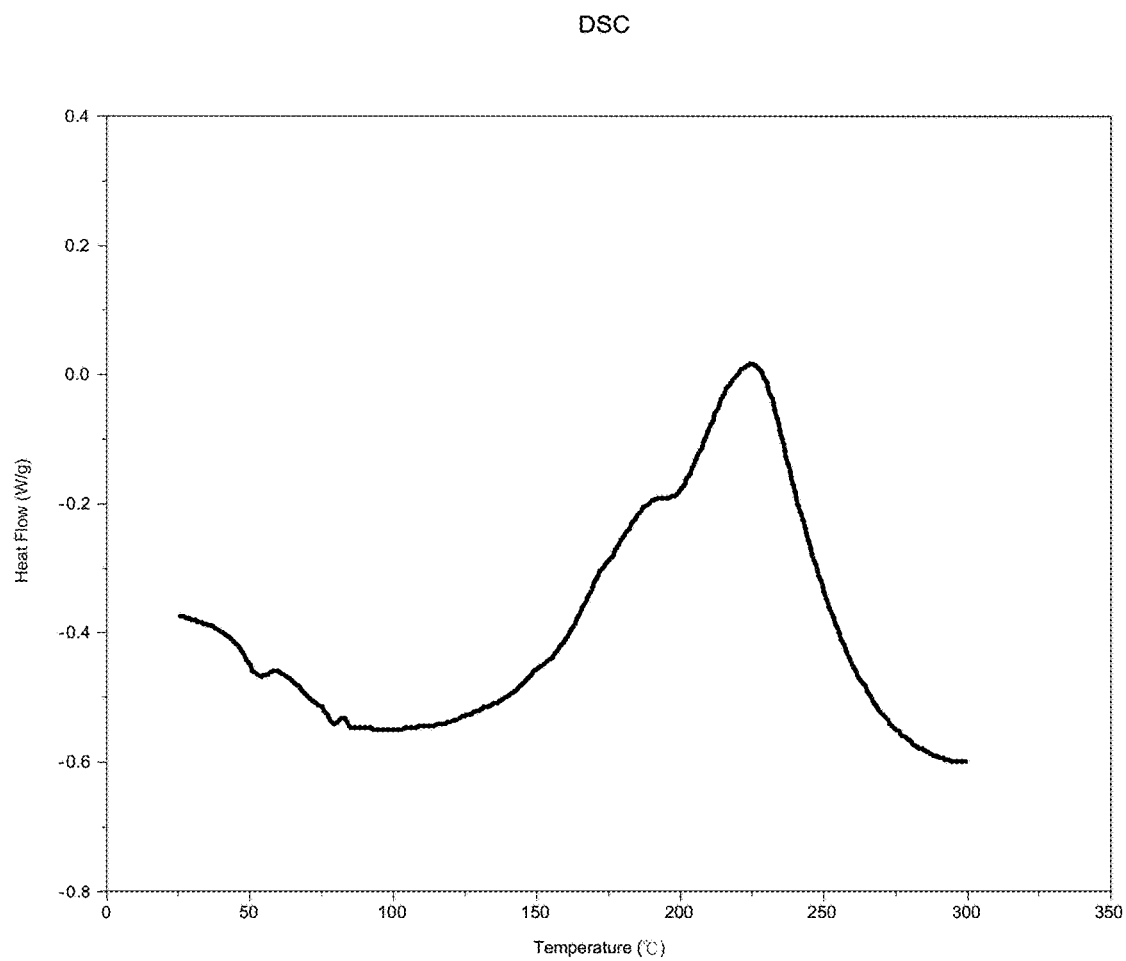
FIG. 4 illustrates a DSC diagram according to a comparative example.

In Comparative Example 1, the epoxy varnish was cured to a specified level after being heated in the oven. The prepreg was folded and the cured epoxy varnish was detached from the woven fiberglass fabric and broke into epoxy powders. The epoxy powders were analyzed with DSC. The epoxy powders were also analyzed based on IPC TM-650 2.3.18A to determine the ratio of the second gel time value to the first gel time value. The DSC diagram is illustrated in FIG. 4, and the ratio of the second gel time value to the first gel time value is 83%.

Copper clad laminates may be prepared from prepregs described in Comparative Example 1 as set forth above, the copper clad laminates was thermomechanically analyzed based on IPC-TM-650 2.4.24.1. For a copper clad laminate prepared from the prepreg in Comparative Example 1, the time to delamination was approximately 13 minutes at an isothermal temperature of 288 degrees Celsius defined in IPC-TM-650 2.4.24.1.

Example 4

In one implementation of preparing an epoxy varnish, the epoxy resin blend can be free of a filler and an allyl compound. The epoxy resin blend can also include only one modifier. In one example, 155 grams of a first brominated epoxy compound, 137 grams of a second brominated epoxy compound, 169 grams of bismaleimide triazine copolymer, 200 grams of styrene maleic anhydride copolymer were mixed with 0.06 grams of cobalt acetylacetonates and 0.3 grams of 2-ethyl-4-methylimidazole in a solvent mixture of methyl ethyl ketone and propylene glycol methyl ether acetate to form the epoxy varnish. The suppliers, the names of the commercially available products and the structures of the chemical substances set forth above are listed in Table 2.

TABLE 2

| Compound | Supplier | Product Name | Structure |
|---|---|---|---|
| Brominated Epoxy 1 | Dow Chemical Co. | DER 560 | Brominated bisphenol-A epoxy resin structure (tetrabromobisphenol-A based diglycidyl ether oligomer) |
| Brominated Epoxy 2 | Hexion Specialty Chemicals, Inc. | 1134 | Brominated bisphenol-A epoxy resin structure |
| Modifier | Mitibushi gas chemical Co. Inc. | BT2110 | Pyrimidine/pyrrolidine/maleimide containing oligomer with Ar = bisphenol-A linkage |
| Crosslinking Agent | Sartomer Company, Inc. | SMA EF-40 Flake | Styrene-maleic anhydride copolymer —[CH—CH$_2$—CH—CH$_2$—CH—CH$_2$—CH—CH$_2$—C——C]— with phenyl pendant groups and anhydride |
| Catalyst 1 | PCI Synthesis Inc. | 2,4-EMI | 2-ethyl-4-methylimidazole |
| Catalyst 2 | Aldrich | cobalt acetylacetonates | $Co(C_5H_7O_2)_3$ |

The epoxy varnish was then used for preparing a prepreg. The same woven fiberglass fabric was immersed in and impregnated with the epoxy varnish set forth above to prepare a prepreg. The oven was configured to be set at several target temperatures at different locations of the oven. The heat sources of the oven are infrared radiant and hot air. A sensor was disposed on the woven fiberglass fabric and configured to record the temperature curve during the period in which the woven fiberglass fabric traveled in the oven. In some implementations, the temperature does not exceed 400 degrees Celsius, since the epoxy varnish is likely to decompose when being heated to such a high temperature. The maximum recorded temperature was approximately 250 degrees Celsius.

Figure 5:
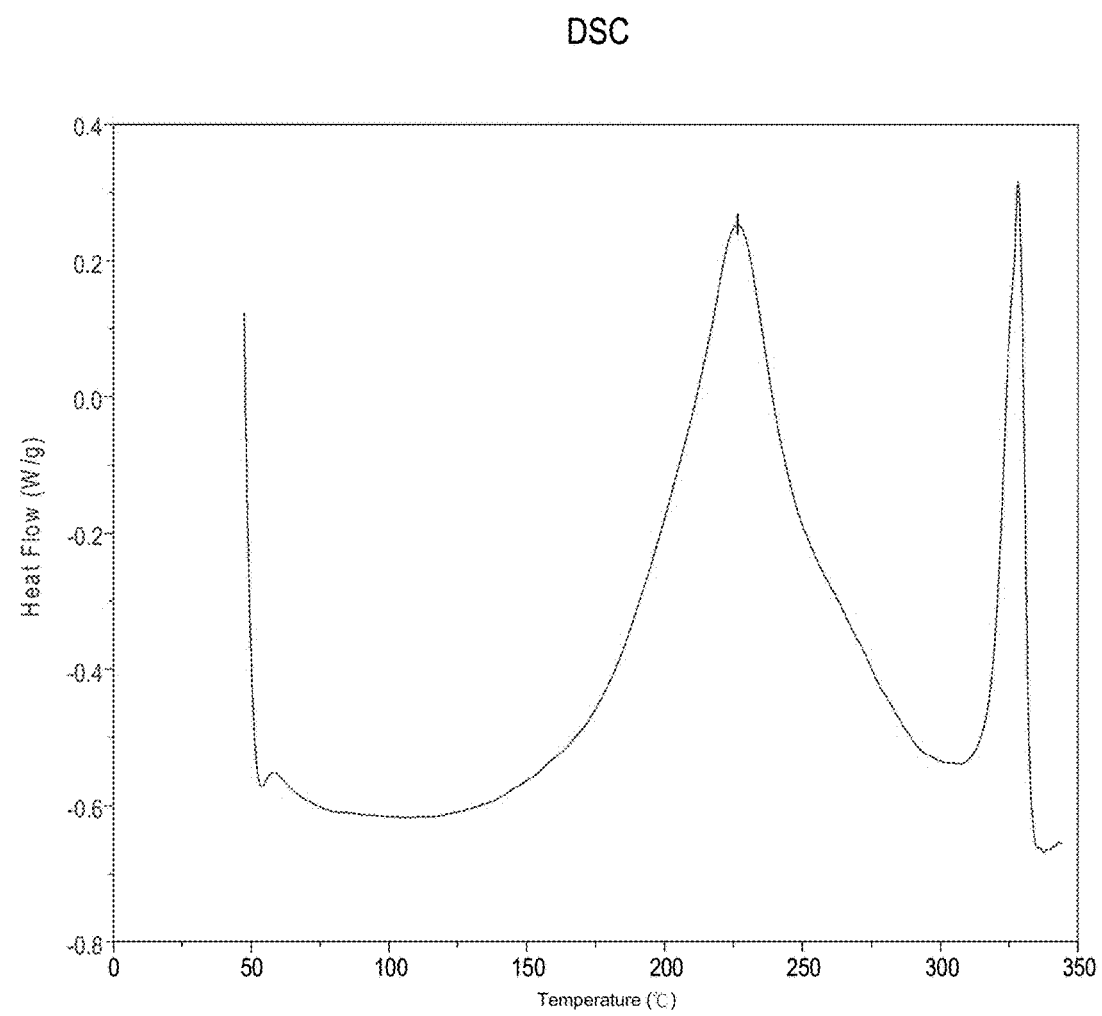
FIG. 5 illustrates a DSC diagram according to one embodiment of the disclosure.

The epoxy varnish was cured to a specified level after being heated in the oven. The prepreg was folded and the cured epoxy varnish was detached from the woven fiberglass fabric and broke into epoxy powders. As set forth above, in Example 4, the epoxy powders were analyzed with DSC. The DSC diagram is illustrated in FIG. 5.

Copper clad laminates may be prepared from the prepregs described in Example 4 according to the method of preparing a copper clad laminate in Example 1. The copper clad laminates prepared from the prepregs described in Example 4 were thermomechanically analyzed based on IPC-TM-650 2.4.24.1, and the time to delamination was approximately 18 minutes at an isothermal temperature of 288 degrees Celsius.

Comparative Example 2

The same woven fiberglass fabric was immersed in the same epoxy varnish prepared in Example 4 to form the same prepreg. The settings of the target temperatures of the oven were changed so that the temperature distributions in the oven were different from the temperature distribution of the oven in Examples 4. The maximum recorded temperatures were approximately 210 degrees Celsius.

Figure 6:
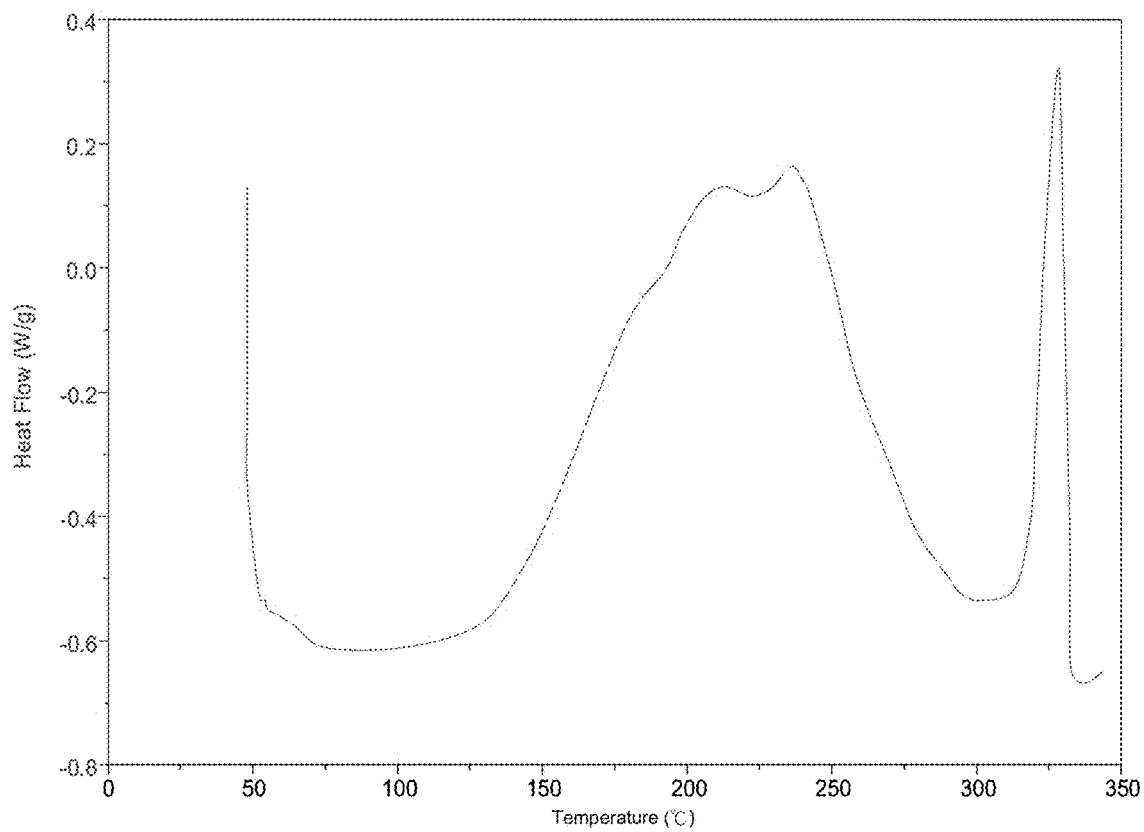
FIG. 6 illustrates a DSC diagram according to a comparative example.

In Comparative Example 2, the epoxy varnish was cured to a specified level after being heated in the oven. The prepreg was folded and the cured epoxy varnish was detached from the woven fiberglass fabric and broke into epoxy powders. The epoxy powders were analyzed with DSC. The DSC diagram is illustrated in FIG. 6.

Copper clad laminates may be prepared from prepregs described in Comparative Example 2 as set forth above, the copper clad laminates was thermomechanically analyzed based on IPC-TM-650 2.4.24.1. For a copper clad laminate prepared from the prepreg in Comparative Example 2, the time to delamination was approximately 13 minutes at an isothermal temperature of 288 degrees Celsius.

While the forgoing is directed to embodiments of the present disclosure, other and further embodiments of the disclosure may be devised without departing from the basic scope thereof, and the scope thereof is determined by the claim that follow.

We claim:
1. A method to prepare a prepreg, comprising:
    applying a mixture on a fibrous material, wherein the mixture includes an epoxy compound, a compound having a ring structure, and a crosslinking agent;
    preparing the prepreg by heating the mixture and the fibrous material to a temperature greater than about 225 degrees Celsius; and
    after the preparing the prepreg, preparing a metal clad laminate based on the prepreg;
    wherein the mixture further comprises an allyl compound comprising an allyl group.
2. The method of claim 1, wherein the mixture and the fibrous material is heated to a temperature greater than about 230 degrees Celsius in the preparing of the prepreg.
3. The method of claim 1, wherein the epoxy compound is brominated or phosphonated.
4. The method of claim 1, wherein the ring structure is a carbon ring structure.
5. The method of claim 1, wherein the ring structure is a heterocyclic ring structure.
6. The method of claim 5, wherein the heterocyclic ring structure includes a nitrogen atom.
7. The method of claim 1, wherein the compound having the ring structure is approximately 10 percent to approximately 30 percent by weight of the mixture.
8. The method of claim 7, wherein the compound having the ring structure is approximately 15 percent to approximately 25 percent by weight of the mixture.
9. The method of claim 1, wherein the epoxy compound is approximately 30 percent to approximately 50 percent by weight of the mixture.
10. The method of claim 1, wherein the crosslinking agent is approximately 20 percent to approximately 40 percent by weight of the mixture.
11. The method of claim 1, wherein the compound having the ring structure is a cyanate ester derived compound.
12. The method of claim 1, wherein the compound having the ring structure is a bismaleimide triazine copolymer.

* * * * *